US006905979B2

United States Patent
Roth et al.

(10) Patent No.: US 6,905,979 B2
(45) Date of Patent: Jun. 14, 2005

(54) APPARATUS AND METHOD FOR IMPROVING AC COUPLING ON CIRCUIT BOARDS

(75) Inventors: Weston Roth, Hillsboro, OR (US); Damion T. Searls, Hillsboro, OR (US); James D. Jackson, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 107 days.

(21) Appl. No.: 10/329,210

(22) Filed: Dec. 23, 2002

(65) Prior Publication Data

US 2004/0119147 A1 Jun. 24, 2004

(51) Int. Cl.$^7$ .............................................. H01L 21/31
(52) U.S. Cl. ..................................... 438/770; 438/785
(58) Field of Search ................................. 438/770–774, 438/785, 635, 687

(56) References Cited

U.S. PATENT DOCUMENTS 3,615,951 A * 10/1971 Franco et al. ................. 216/17

* cited by examiner

Primary Examiner—Douglas Wille
Assistant Examiner—Ginette Peralta
(74) Attorney, Agent, or Firm—Marger Johnson McCollom, P.C.

(57) ABSTRACT

The invention relates to an apparatus and method for improving AC coupling between adjacent signal traces and between plane splits and signals spanning plane splits on circuit boards. A circuit board includes adjacent conductive means and an oxide means interposed there between. The oxide means is a copper oxide, e.g., cupric or cuprous oxide. In one embodiment, the adjacent conductive means are adjacent voltage reference planes with a split interposed between the conductive means. The copper oxide fills the split. In another embodiment, the adjacent conductive means are differential signal traces. The copper oxide fills a gap between the differential signal traces. The copper oxide is a non-conductive material with an increased dielectric constant as compared to other common dielectric materials used as fillers. The increased dielectric constant increases capacitance, in turn, increasing AC coupling.

15 Claims, 6 Drawing Sheets

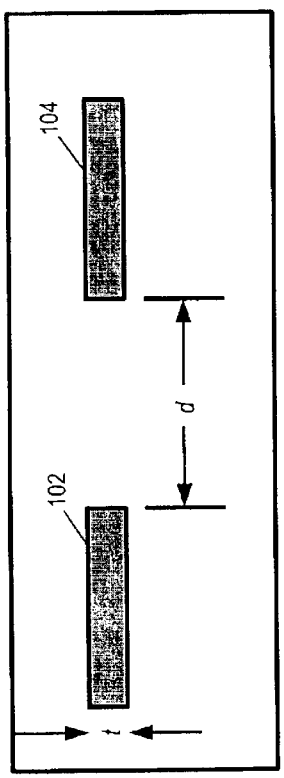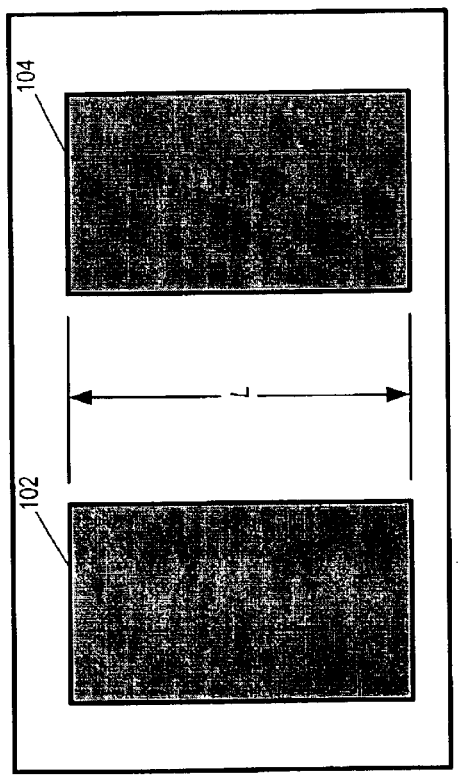

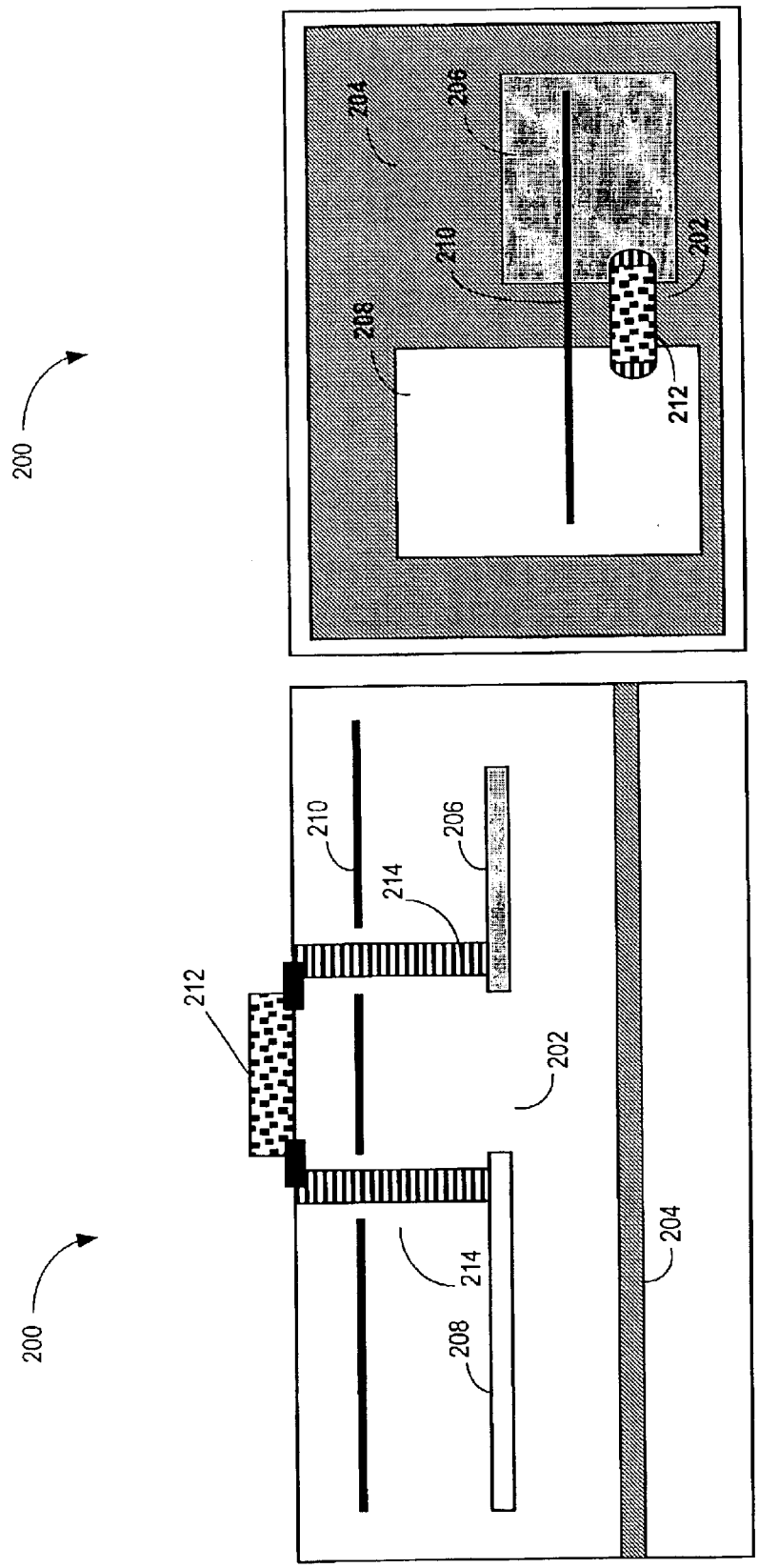

APPARATUS AND METHOD FOR IMPROVING AC COUPLING ON CIRCUIT BOARDS

BACKGROUND OF THE INVENTION

1. Field of the Invention

The invention relates to circuit boards (CBs), e.g., printed circuit boards, imprinted boards, and any other support substrate. More particularly, to an apparatus and method for improving alternate current (AC) coupling on CBs.

2. Description of the Related Art

CB designers often optimize signal trace and voltage reference plane design to enhance performance. In many instances, a need exists to enhance or strengthen AC coupling between two signal traces or conductors. This is particularly true when dealing with differential signals. For differential signals, strong AC coupling reduces cross talk and allows high frequency, low-noise, signaling at low voltage levels.

A plane split is another CB structure that benefits from strong AC coupling. A plane split is a discontinuity formed in a voltage reference plane (e.g., power or ground plane). A plane split is necessary to prevent short circuits in signals routed between signal layers formed on top and below the voltage reference planes. A split in the power or ground plane might adversely impact signal integrity (SI) and electromagnetic containment (EMC) on signal traces routed over the split on adjacent signal layers.

The AC coupling between two adjacent signal traces or planes is determined by the capacitance between them. The capacitance, in turn, is governed in part by the dielectric material used to provide direct current (DC) isolation between the traces. The capacitance is directly proportional to the dielectric constant k of the material between the traces. If k is large, so is the capacitance resulting in strong AC coupling between the adjacent traces.

FIG. 1A is a cross sectional view of two adjacent signal traces. FIG. 1B is a top down view of the traces shown in FIG. 1A. Referring to FIGS. 1A–B, traces 102 and 104 are each a dimension t thick. The trace 102 is separated from the trace 104 by a dimension d. The traces 102 and 104 are each a dimension L long. Equation 1 gives the capacitance between the traces 102 and 104.

$$C = \frac{kA}{d} = \frac{k(Lt)}{d} \qquad \text{Equation 1}$$

In Equation 1, k is the dielectric constant of the material between the traces, A is the minimum overlapping surface area between the traces, and d is the dielectric thickness between the traces. The surface area A is alternately expressed as the product of the length L times the thickness t of the traces.

Typical CB designs use copper materials for the signal traces and voltage reference planes. And typical CB designs use a fiberglass mesh material, e.g., FR4, for the CB core. The electrical properties of these copper and fiberglass materials have been thoroughly studied and are well understood. Exclusively using copper materials for trace and reference plane design and fiberglass materials for CB cores results in limiting capacitance control to geometry. If the material used for the signal traces and core is fixed, trace geometry remains the sole manner of capacitance control.

Increased capacitance C increases AC coupling for differential signals. Increased capacitance C is obtained in a fixed material CB design by increasing the area A or by minimizing the distance d. Increasing the trace length L or the trace thickness t, in turn, increases the area A. The trace length L is usually limited by the CB's physical size that must fit within a predetermined space, e.g., in the palm of one's hand for a hand held personal digital assistant. And increasing the trace length L oftentimes adversely affects SI and EMC by increasing the inductance loop area.

Using thicker copper materials increases the trace thickness t. For example, the trace thickness t increases if 2-ounce copper is used instead of 1-ounce copper for the signal trace layer of the CB. Using thicker copper materials, however, increases system cost. Most CB designers, therefore, increase AC coupling by minimizing the distance d between adjacent traces. But current technologies only allow etching spaces d between adjacent copper traces of specified magnitudes. Further minimization of d requires more sophisticated, expensive, technology that, in turn, increases cost.

The same geometrical arguments for differential signals also hold for plane splits. Increasing the length of the split L is undesirable, since increasing the length of the split adversely affects SI and further complicates signal routing on adjacent layers. Increasing the thickness t by using thicker copper materials increases system cost as mentioned earlier. Minimizing split spacing d is one option for increasing AC coupling between CB layers. Another option is the use of stitching capacitors.

FIG. 2A is a cross sectional view of an exemplary CB 200 with a split 202. FIG. 2B is a top view of the CB 200. Referring to FIGS. 2A–B, the CB 200 includes a ground plane (or layer) 204 and voltage planes (or layers) 206 and 208. A plane split 202 exists between voltage planes 206 and 208. A signal 210 bridges or spans the split 202 as most clearly shown in FIG. 2B. A stitching capacitor 212 electrically couples the plane 208 to the plane 206 through vias 214. The stitching capacitor 212 provides AC coupling that reduces EM radiation at the split reducing, in turn, adverse SI and EMC. The addition of stitching capacitors, however, is costly. One stitching capacitor is required for each signal crossing a split. Thus, the CB component count increases, increasing cost. More components require additional CB real estate, also increasing cost.

Accordingly, a need remains for an apparatus and method for improving AC coupling between differential signal traces and signals routed over plane splits on circuit boards.

BRIEF DESCRIPTION OF THE DRAWINGS

The foregoing and other objects, features, and advantages of the invention will become more readily apparent from the detailed description of an embodiment that references the following drawings.

FIG. 1A is a cross sectional view of adjacent traces on a CB.

FIG. 1B is a top view of the adjacent traces shown in FIG. 1A.

FIG. 2A is a cross sectional view of a plane split on a CB.

FIG. 2B a top view of the CB shown in FIG. 2A.

DETAILED DESCRIPTION OF THE PREFERRED EMBODIMENT

Figure 3A:
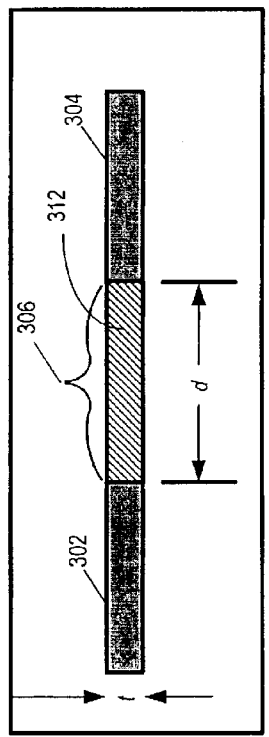
FIG. 3A is a cross sectional view of an embodiment of adjacent traces according to the present invention.
Figure 3B:
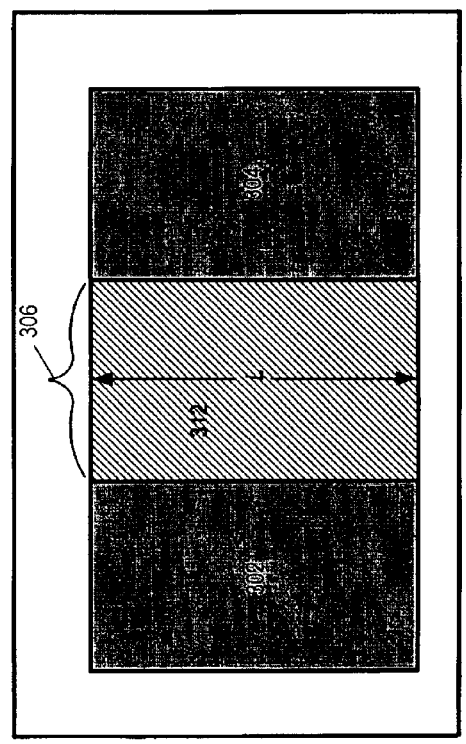
FIG. 3B is a top view of the adjacent traces shown in FIG. 3A.

FIG. 3A is a cross sectional view of adjacent traces on a CB according to the present invention. FIG. 3B is a top view of the adjacent traces shown on FIG. 3A. Referring to FIGS. 3A–B, a first conductor 302 is adjacent a second conductor 304. A gap 306 is interposed between the first and second conductors 302 and 304, respectively. The first and second conductors 302 and 304 might represent a differential signal routed on a signal layer (not shown) of a CB (not shown). In one embodiment, the first and second conductors 302 and 304 are a copper material e.g., 1 or 2-ounce copper but other suitable materials are well known. A person of reasonable skill in the art should recognize that several methods to form the conductors 302 and 304 on a CB e.g., standard copper etching processes that chemically etch and define patterns, planes, lines, and the like on CBs.

Figure 4A:
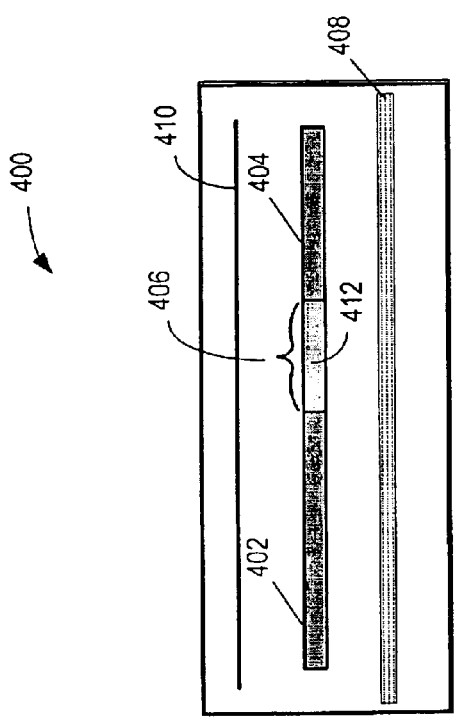
FIG. 4A is a cross sectional view of an embodiment of a CB according to the present invention.
Figure 4B:
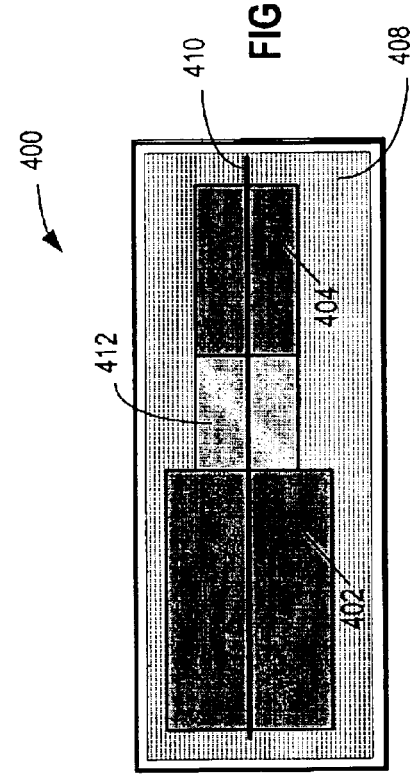
FIG. 4B is a top view of the CB shown in FIG. 3A.

FIG. 4A is a cross sectional view of one embodiment of a CB according to the present invention. FIG. 4B is a top view of the CB shown in FIG. 4A. Referring to FIGS. 4A–B, a CB 400 includes a ground plane 408 and voltage planes 402 and 404. A core (not shown) is typically interposed between the ground plane 408 and the reference planes 402 and 404. The core provides structural strength and rigidity to the CB 400 and is comprised of a non-conductive material, e.g., FR4. A person of reasonable skill in the art should recognize a variety of materials for CB cores.

The CB 400 is shown with a ground plane 408 and two reference planes 402 and 404 for simplicity. A person of reasonable skill in the art should recognize that any number of voltage reference planes, like planes 408, 402, and 404, are encompassed by the present invention.

The ground plane 408 provides a ground (e.g., GND) to signal traces routed on signal layers (not shown). Similarly, the reference planes 402 and 404 provide a power supply voltage (e.g., VCC) to signal traces routed on signal layers (not shown). The reference planes 402 and 404 might alternatively provide a first and second power supply voltages (e.g., VCC1 and VCC2), respectively, to signal traces routed on signal layers (not shown). The ground plane 408 and reference planes 402 and 404 might comprise 1 or 2-ounce copper or other well-known suitable materials. A person of reasonable skill in the art should recognize well-known methods for forming the ground plane 408 and the reference planes 402, and 404, e.g., electroless or electroplating processes.

Splits are formed in the reference planes, e.g., split 406 formed between the voltage reference planes 402 and 404. A person of reasonable skill in the art should recognize well-known methods for forming splits 406, e.g., standard copper etching processes that chemically etch and define patterns, planes, lines, and the like on conductive layers such as reference planes 402 and 404.

Figure 5B:
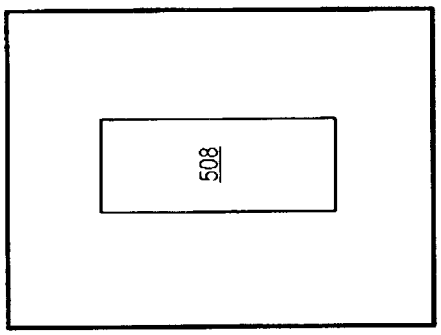
FIG. 5B is a top view of a plane slot.
Figure 5C:
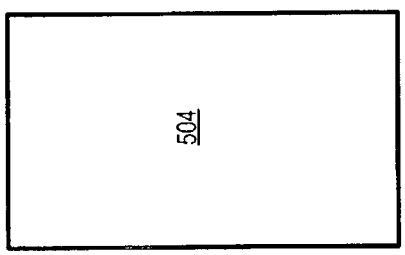
FIG. 5C is a top view of a plane cutout.
Figure 5A:
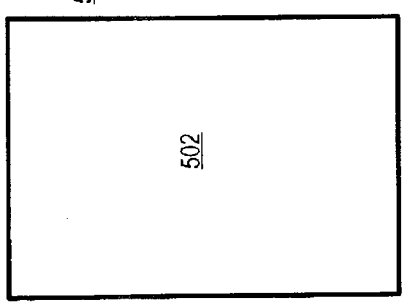
FIG. 5A is a top view of a plane split.

Referring to FIGS. 4A–B and 5A–C, the split 406 might have a variety of shapes including a split 506 where it separates two voltage reference planes 502 and 504 from end to end (FIG. 5A), a slot 508 (FIG. 5B), or a cutout 510 (FIG. 5C). For simplicity, all manner of voltage reference plane discontinuities are termed splits. As mentioned before, plane splits, like split 406, allow a signal to be cross routed from one signal layer to another without shorting through the ground and power reference planes 408, 402, and 404. Although the single split 406 is shown between planes 402 and 404, a person of reasonable skill in the art should recognize that any number of splits is possible in any number of reference planes.

Referring to FIGS. 3A–B and 4A–B, an oxide material 312 (412) fills the gap 306 (split 406). In one embodiment, the oxide material 312 (412) is a copper oxide, e.g., cupric oxide (CuO) and cuprous oxide ($Cu_2O$). The dielectric constant k of CuO is in the range of about 11–18.1. The dielectric constant of $Cu_2O$ is in the range of about 7.6–10. In contrast, the dielectric constant k of FR4 is about 4.5.

The use of a copper oxide 312 (412) to fill the gap 306 (split 406) instead of using other dielectric materials like FR4 increases the capacitance C in direct proportion to the increase in dielectric constant k. An increase in the capacitance C, increases the AC coupling between the adjacent traces 302 and 304 or between the adjacent reference planes 402 and 404. The integration of copper oxides as a dielectric filler material between differential traces and plane splits increases capacitance and, therefore, AC coupling. And copper oxide 312 (412) has a low direct current (DC) electrical conductivity making it an adequate material for DC electrical isolation.

Table 1 compares the differential coupling strength between FR4 and copper oxide, as measured by capacitance. Table 1 assumes a 100 mil long trace, 1-ounce copper traces 1.4 mils thick, and 5 mil differential spacing. The dielectric constant for copper oxide is conservatively estimated at k=10.

TABLE 1

|  | FR-4 Dielectric | Copper Oxide |
| --- | --- | --- |
| Thickness (mils) | 1.4 | 1.4 |
| Space (mils) | 5 | 5 |
| Length (mils) | 100 | 100 |
| Dielectric constant | 4.5 | 10 |
| Capacitance | 126 | 280 |

Table 1 indicates a greater than 2× improvement in capacitance C and, therefore, a 2× improvement in differential coupling when using a copper oxide rather than FR4 as a gap 306 and split 406 filler material. Using copper oxide relaxes CB fabrication requirements when forming differential traces since the trace spacing d can be relaxed to obtain the same capacitance C. For example, the spacing d can be increased from 5 to 11 mils without a decrease in capacitance C by using the copper oxide in place of FR4 as the filler material. Relaxing the trace spacing requirements directly, downwardly, impacts CB fabrication costs.

Figure 6:
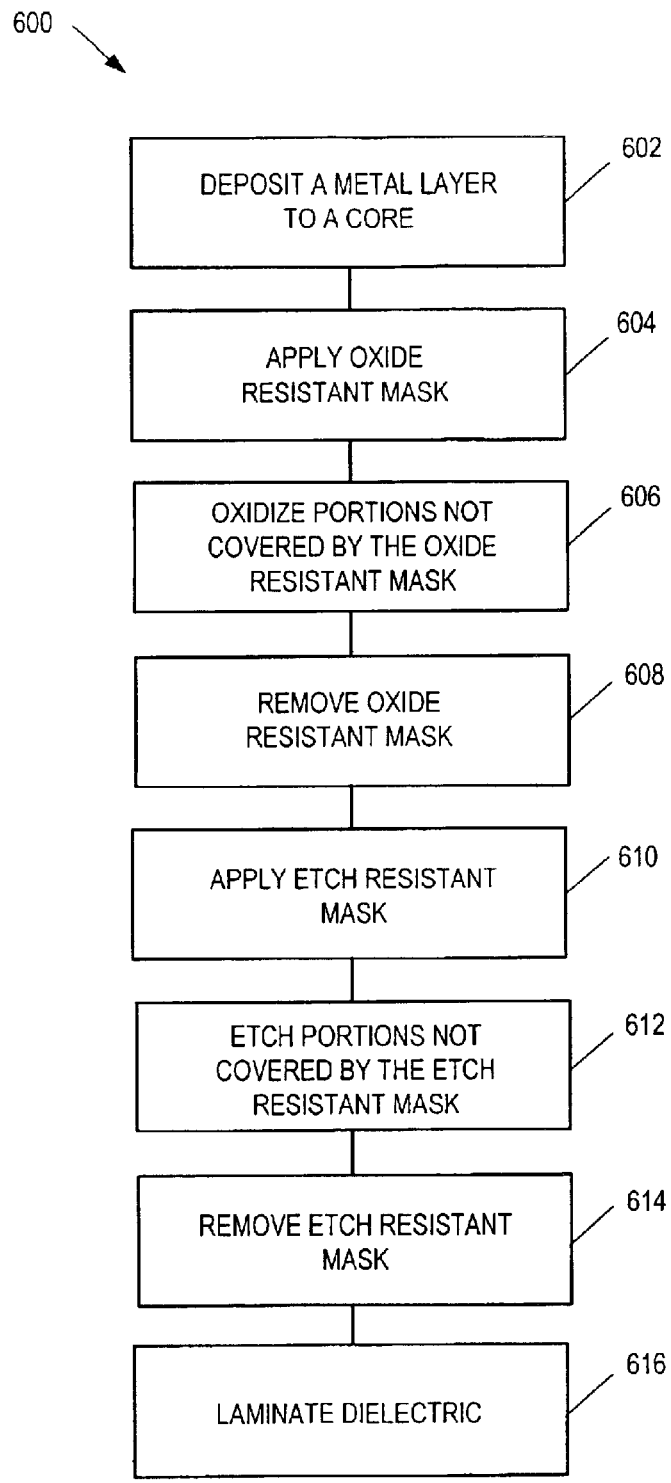
FIG. 6 is a flowchart of an embodiment of the CB manufacturing method of the present invention.

An embodiment of a method for fabricating CBs according to the present invention will now be described. Current CB fabrication technology involves a repeated stack up of alternating metal and dielectric layers. Referring to FIG. 6, a metal layer is deposited on a dielectric core at 602. The dielectric core adds structural integrity and rigidity to the CB as mentioned earlier. Examples of dielectric layers include FR4, woven-glass fiber, and epoxy. Examples of metal layers include electroplated or foil copper. At 604, an oxide resistant mask is applied to the CB. The oxide resistant mask is, in one embodiment, a 1:1 scale of the desired copper conductor patterns.

At 606, the masked CB is placed in an oxidizing environment such that portions of the metal layer not covered by the oxide resistant mask chemically react to form a non-conductive copper oxide. That is, openings in the oxide resistant mask oxidize the underlying metal layer to form the copper oxide. Since copper oxide is an electrically non-conductive dielectric, it provides DC in-plane isolation between the copper traces and between planes.

The oxidation process used to oxidize the metal layer could be any of a number of well-known wet and dry chemical processes. For example, a liquid chemical process such as one involving nitric acid oxidizes copper metal. This reaction produces cuprous oxide $Cu_2O$. For another example, a dry chemical process involves exposing the metal layer to a partially ionized gas of oxygen ($O_2$) plasma consisting of atomic oxygen radicals (O), ions ($O^+$, $O^-$), and molecular oxygen ions ($O_2^+$, $O_2^-$). The broad oxidizing species produces a mixture of cupric CuO and cuprous Cu2O oxide, among other possible copper oxides. The result is a non-conductive dielectric copper oxide. At 608, the oxide resistant mask is removed.

In one embodiment, the oxidation process is used in place of the standard copper etching process used for CB fabrication, without the need for additional processing. The oxidation of the metal layer for the purpose of trace patterning provides an added benefit as compared to etching: a more planar CB. This improved planarity results in improved lamination, pattern registration and alignment, and dielectric uniformity. The oxidation process, on the other hand, does not preclude the use of metal layer etching if such is desired.

At 610, an etch resistant mask is applied to the CB. Openings in the etch resistant mask allow unwanted metal to be chemically etched away using well-known etching processes (612). The etch resistant mask is removed (614) and a dielectric is laminated on the etched metal layer to provide electrical isolation between conductive planes (616).

Having illustrated and described the principles of our invention, it should be readily apparent to those skilled in the art that the invention can be modified in arrangement and detail without departing from such principles. We claim all modifications coming within the spirit and scope of the accompanying claims.

We claim:

1. A method for manufacturing a circuit board, comprising:

depositing a conductive layer on a non-conductive core;

oxidizing portions of the conductive layer such that the oxidized portions become non-conductive; and applying non-conductive layer to the conductive layer after oxidation.

2. The method of claim 1 wherein depositing includes depositing a conductive layer on an FR4 core.

3. The method of claim 1 wherein depositing includes depositing a copper layer that is one of a foil-laminated copper and an electroplated copper.

4. The method of claim 1 wherein oxidizing includes using a liquid chemical oxidation process.

5. The method of claim 1 wherein oxidizing includes using a gaseous plasma oxidation process.

6. The method of claim 1 comprising etching the conductive layer prior to applying the non-conductive layer.

7. The method of claim 6 where etching the conductive layer comprises:

applying an etch resistant mask to the conductive layer after oxidation;

etching portions the masked conductive layer not covered by the etch resistant mask; and removing the etch resistant mask.

8. The method of claim 6 wherein the conductive layer is etched after oxidization.

9. The method of claim 6 wherein the non-conductive layer is applied on the etched conductive layer.

10. The method of claim 1 where oxidizing portions of the conductive layer comprises:

applying an oxide-resistant mask to the conductive layer;

oxidizing portions of the masked conductive layer not covered by the oxide resistant mask; and removing the oxide-resistant mask.

11. The method of claim 10 wherein applying includes applying an oxide-resistant mask that is a scale pattern of desired conductor patterns.

12. The method of claim 10 wherein oxidizing includes forming a copper oxide on the portions of the conductive layer not covered by the oxide-resistant mask.

13. The method of claim 12 wherein oxidizing includes forming a cuprous oxide on the portions of the conductive layer not covered by the oxide-resistant mask.

14. The method of claim 12 wherein oxidizing includes forming a cupric oxide on the portions of the conductive layer not covered by the oxide-resistant mask.

15. The method of claim 1 wherein applying the non-conductive layer includes laminating the non-conductive layer to the conductive layer.

\* \* \* \* \*